(12) United States Patent
Timmons et al.

(10) Patent No.: US 6,607,785 B2
(45) Date of Patent: Aug. 19, 2003

(54) BUBBLER

(75) Inventors: Michael L. Timmons, Durham, NC (US); Richard J. Colby, Newburyport, MA (US); Robert S. Stennick, North Andover, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 92 days.

(21) Appl. No.: 09/870,245

(22) Filed: May 30, 2001

(65) Prior Publication Data

US 2002/0078894 A1 Jun. 27, 2002

Related U.S. Application Data

(60) Provisional application No. 60/208,257, filed on May 31, 2000.

(51) Int. Cl.⁷ .............................................. C23C 16/00
(52) U.S. Cl. ...................... 427/248.1; 261/94; 261/100; 392/386; 392/387; 34/380; 34/507; 34/523; 118/726
(58) Field of Search .................... 261/94, 100; 118/726; 34/380, 507, 523; 392/386, 387; 427/248.1

(56) References Cited

U.S. PATENT DOCUMENTS

| | | | |
|---|---|---|---|
| 4,916,828 A | * | 4/1990 | Yamane et al. ............... 34/364 |
| 4,947,790 A | * | 8/1990 | Gartner et al. .............. 118/715 |
| 5,553,395 A | * | 9/1996 | Wen et al. .................... 34/359 |
| 5,711,816 A | * | 1/1998 | Kirlin et al. ................ 118/726 |
| 6,444,038 B1 | * | 9/2002 | Rangarajan et al. ......... 118/715 |

FOREIGN PATENT DOCUMENTS

GB 2223509 * 11/1990

OTHER PUBLICATIONS

EMC.RE—CAD Generated Drawing; Weldment Bubbler 2" Liquid Source; Drawing No. 1001356, Jun. 5, 1991.
EMC.RE—CAD Generated Drawing; VCR Gland Auto Weld, ¼"; Drawing No. 8335E01, Mar. 5, 1993.
EMC.RE—CAD Generated Drawing; End Cap 2" Liquid Source; Drawing No. 1001401, Jun. 5, 1991.
EMC.RE—CAD Generated Drawing; Tube, 2" Solid Source Bubbler; Drawing No. 1000625, Aug. 15, 1990.
EMC.RE—CAD Generated Drawing; Cover Solid Source Bubbler; Drawing No. 1000627, Aug. 15, 1990.
EMC.RE—CAD Generated Drawing; Weldment Thermocouple Retainer; Drawing No. 1000630, Sep. 24, 1990.
EMC.RE—CAD Generated Drawing; ¼ Elbow ATW; Drawing No. 9107E01, Nov. 30, 1989.
EMC.RE—CAD Generated Drawing; Valve, Manual, Bn, VESPEL ¼; Drawing No. 1001510, Aug. 19, 1991.
EMC.RE—CAD Generated Drawing; VCR Male Nut 1/4" ; Drawing No. 6344E01, Dec. 5, 1989.
EMC.RE—CAD Generated Drawing; Bubbler, 2" Solid Source Weldment; Drawing No. 1000624, Oct. 3, 1990.
EMC.RE—CAD Generated Drawing; VCR Gland Auto Weld, ¼"; Drawing No. 8335E01, Mar. 5, 1993.
EMC.RE—CAD Generated Drawing; End Cap 2" Solid Source; Drawing No. 1000626, Aug. 15, 1990.
EMC.RE—CAD Generated Drawing; Plate, Porous 2" Solid Source Bubbler; Drawing No. 1000628, Sep. 24, 1990.

(List continued on next page.)

*Primary Examiner*—Richard Bueker
(74) *Attorney, Agent, or Firm*—S. Matthew Cairns

(57) ABSTRACT

Disclosed are dual chambered bubbler designs for use with solid organometallic source material for chemical vapor phase deposition systems, and a method for transporting a carrier gas saturated with source material for delivery into such systems.

12 Claims, 3 Drawing Sheets

OTHER PUBLICATIONS

EMC.RE—CAD Generated Drawing; Tube, 2" Solid Source Bubbler; Drawing No. 1000625, Aug. 15, 1990.

EMC.RE—CAD Generated Drawing; Cover Solid Source Bubbler; Drawing No. 1000627, Aug. 15, 1990.

EMC.RE—CAD Generated Drawing; Weldment Thermocouple Retainer; Drawing No. 1000630, Sep. 24, 1990.

EMC.RE—CAD Generated Drawing; Valve, Manual, BN VESPEL ¼; Drawing No. 1001510, Aug. 19, 1991.

EMC.RE—CAD Generated Drawing; VCR Male Nut ¼"; Drawing No. 1001356, Jun. 5, 1991.

* cited by examiner

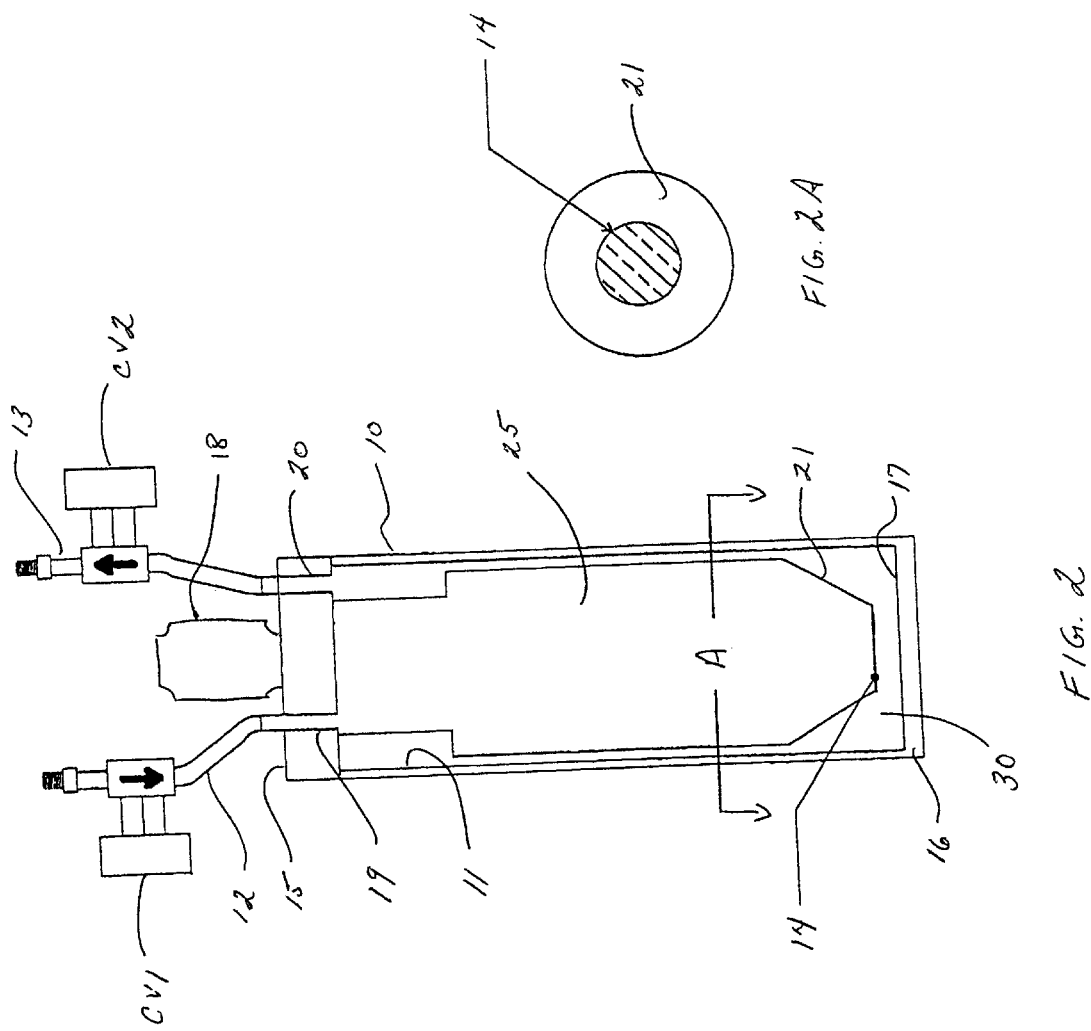

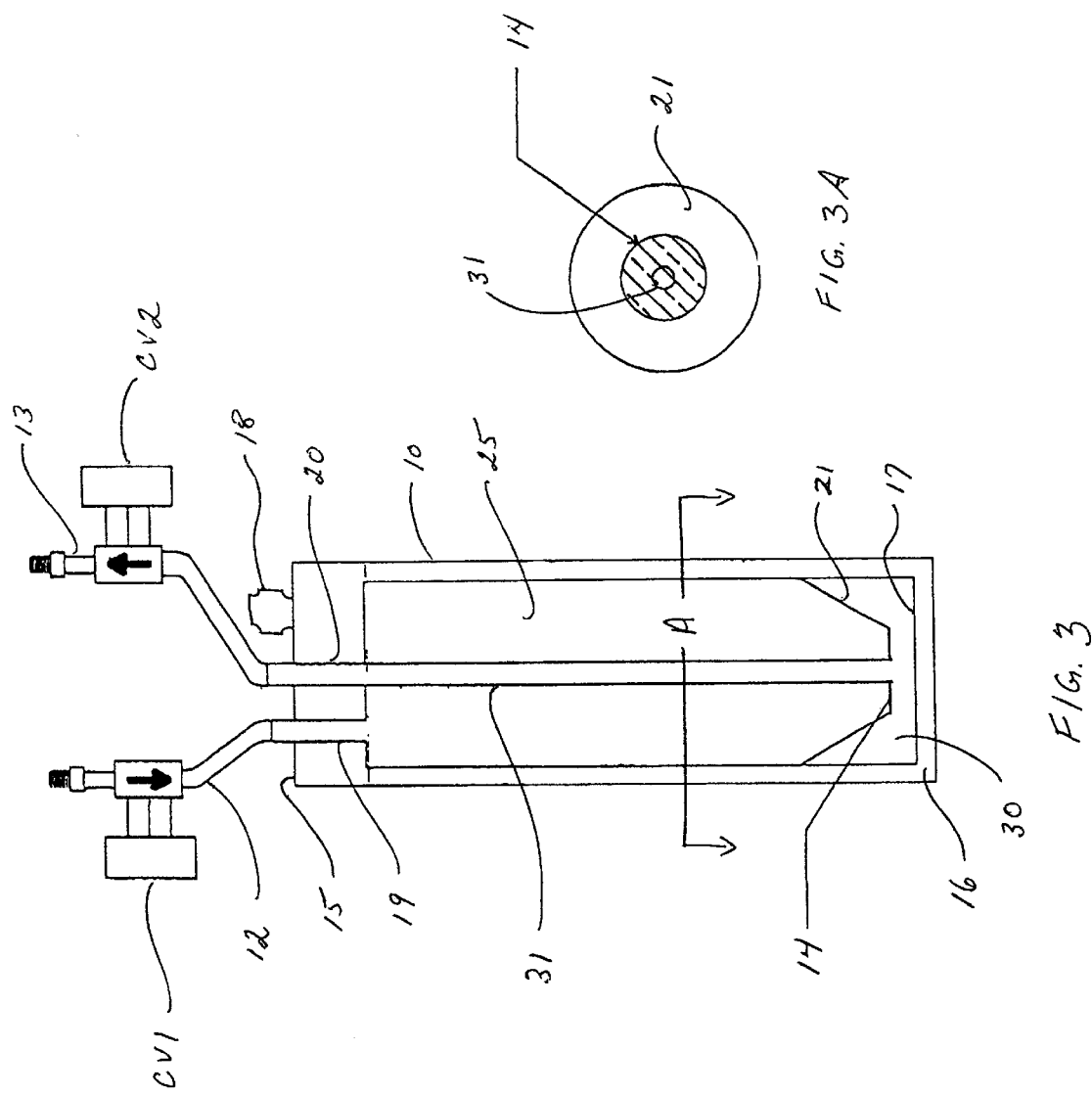

BUBBLER

This application claims the benefit of U.S. Provisional Application(s) No(s).: 60/208,257 filed May 31, 2000.

BACKGROUND OF THE INVENTION

The present invention relates generally to a vapor generator for use in vapor deposition equipment. In particular, the present invention relates to a vapor generator designed for the requirements of vapor phase epitaxy and other chemical vapor deposition equipment.

Group III-V compound semiconductor materials including different monocrystalline layers with varying compositions and with thickness ranging from fractions of a micron to a few microns are used in the production of many electronic and optoelectronic devices such as lasers and photodetectors. Chemical vapor deposition methods using organometallic compounds are typically employed in the chemical vapor deposition ("CVD") art for the deposition of metal thin-films or semiconductor thin-films of Group III-V compounds. Compounds typically used as precursors in CVD for the semiconductor industry include cyclopentadienyl magnesium ("$Cp_2Mg$"), trimethyl aluminum ("TMA"), trimethyl gallium ("TMG"), triethyl gallium ("TEG"), trimethyl antimony ("TMSb"), dimethyl hydrazine ("DMHy"), trimethyl indium ("TMI") and the like. Solid precursors, such as TMI, are used in the metal-organic-vapor-phase-epitaxy ("MOVPE") of indium containing semiconductors.

Typically, such solid precursors are placed in a cylindrical vessel or container referred to as a "bubbler" and subjected to a constant temperature wherein the solid precursor is vaporized. A carrier gas, such as hydrogen, is employed to pick up the precursor compound vapor and transport it to a deposition system. Most solid precursors exhibit poor and erratic delivery rates when used in conventional bubbler-type precursor vessels. Such conventional bubblers include both bubbler vessels having a dip-tube attached to the inlet, see for example U.S. Pat. No. 4,506,815 (Melas et al.), or the gas-feeding device as disclosed in U.S. Pat. No. 5,755,885, which has a plurality of gas-ejecting holes in the dip-tube to introduce the carrier gas into the container. Such conventional bubbler systems can result in a non-stable, non-uniform flow rate of the precursor vapors, especially when solid organometallic precursor compounds are used. Non-uniform flow rates produce an adverse affect on the compositions of the films, particularly semiconductor films, being grown in MOVPE reactors.

Other bubbler systems have been developed, such as that developed by Morton International, Inc., which eliminates the use of a dip-tube. However, while such dip-tube free bubblers were found to provide a uniform flow rate, they failed to provide a consistently high concentration of precursor material. The inability to achieve a stable supply of feed vapor from solid precursors at a consistently high concentration is problematic to the users of such equipment, particularly in semiconductor device manufacture. The unsteady organometallic precursor flow rate can be due to a variety of factors including progressive reduction in the total surface area of chemical from which evaporation takes place, channeling through the solid precursor compound where the carrier gas has minimal contact with the precursor compound and the sublimation of the precursor solid material to parts of the bubbler where efficient contact with the carrier gas is difficult or impossible.

Various methods have been adopted to overcome the flow problems such as the use of revers flow bubblers, the use of dispersion materials in the precursor materials, employing diffuser plates beneath the bed of solid precursor material, employing conical cylinder designs and beating on the cylinder to de-agglomerate the solid precursor material. For example, U.S. Pat. No. 4,704,988 (Mellet) discloses a bubbler wherein the vessel is separated by a porous partition into first and second compartments. In this design, the precursor material is contained in the first compartment in a liquid state and when vaporized diffuses through the partition into the second compartment where it contacts and is entrained in a carrier gas for transport from the vessel into the appropriate deposition chamber.

U.S. Pat. No. 5,603,169 (Kim) discloses a bubbler design having lower and upper porous plates through which the carrier gas passes. The lower porous plate is located above the carrier gas feed inlet and supports the solid precursor material. In operation, carrier gas passes through the lower porous plate before contacting the solid precursor material. A compressing plate is located above the lower porous plate for pressing the precursor material by its weight. Such bubbler design is quite complex and suffers from a problem of fluidizing the solid precursor material due to carrier flow through the porous plug before passing upward, i.e. against gravity, through the bubbler. This causes changes in the effective area of the solid precursor material which adversely affects the performance of the bubbler.

Conventional bubbler designs fail to provide a uniform flow rate with maximum pick-up of precursor material. There is thus a continuing need for stable flow/pick-up of solid precursor material vapor. Further, there is a need for bubbler devices that are tailored to provide a uniform and high concentration of precursor material vapor until total depletion of the vapor source.

SUMMARY OF THE INVENTION

It has been surprisingly found that the bubbler designs of the present invention provide a stable flow rate of precursor material vapor, provide a high concentration of precursor vapor in the carrier gas, can be used at lower pressures than conventional bubblers, and provides maximum contact of the carrier gas with the precursor material.

In one aspect, the present invention provides a device for providing vaporized organometallic compound to a chemical vapor deposition system including a vessel having an elongated cylindrical shaped portion having an inner surface defining a substantially constant cross-section throughout the length of the cylindrical portion, a top closure portion, a bottom closure portion, and inlet and outlet chambers in fluid communication and separated by a porous element, the top closure portion having a fill plug and a gas inlet opening, the fill plug and gas inlet opening communicating with the inlet chamber, the outlet opening communicating with the outlet chamber, the inlet chamber having a conical shaped lower portion containing the porous element, the porous element being spaced from the bottom closure portion.

In a second aspect, the present invention provides a method for providing organometallic precursor compound in the vapor phase to a chemical vapor deposition system including the steps of: a) introducing an organometallic precursor compound into the device described above; b) heating the organometallic precursor compound; c) passing a carrier gas through the organometallic precursor compound to provide a gas stream containing vaporized organometallic precursor compound; and d) delivering the gas stream to a chemical vapor deposition system.

In a third aspect, the present invention provides an apparatus for chemical vapor deposition of an organometallic precursor compound including the device described above.

BRIEF DESCRIPTION OF THE DRAWINGS

FIG. 2 is a cross-sectional view illustrative of a bubbler of the present invention having an annular design.

FIG. 2A is a cross-sectional view of the conical section of the inlet chamber of the bubbler of FIG. 2.

FIG. 3 is a cross-sectional view illustrative of a bubbler of the present invention having a non-annular design.

FIG. 3A is a cross-sectional view of the conical section of the inlet chamber of the bubbler of FIG. 3.

DETAILED DESCRIPTION OF THE INVENTION

Figure 1:
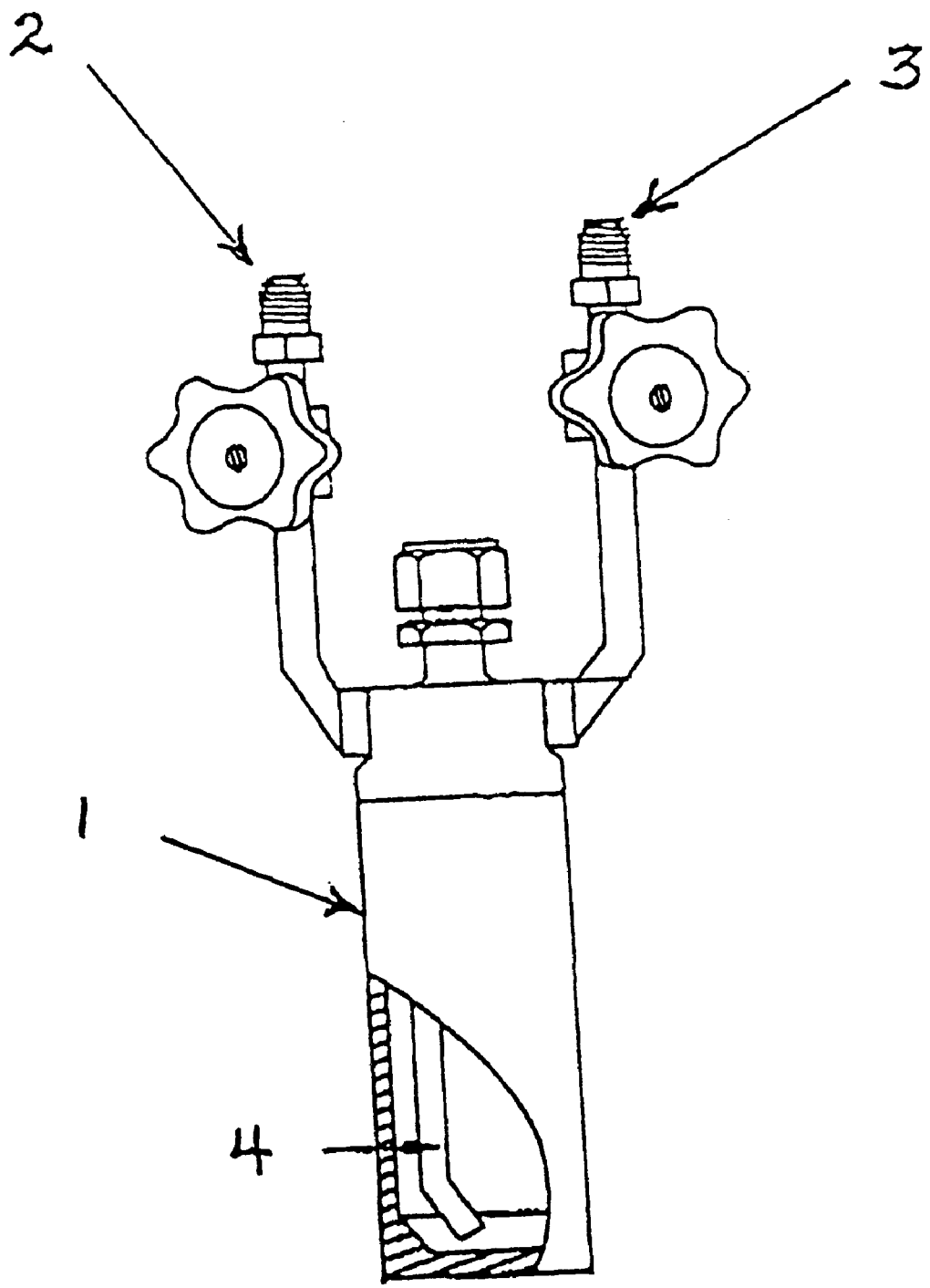
FIG. 1 is a cross-sectional view illustrative of a conventional dip-tube bubbler.

As used throughout the specification, the following abbreviations shall have the following meanings unless the context clearly indicates otherwise: cm=centimeter, sccm=standard cubic centimeter per minute; and ° C.=degrees Centigrade. All numerical ranges are inclusive and combinable.

The vapor generator or bubbler of the present invention is designed to eliminate poor and erratic delivery rates exhibited by known designs as well as their inability to provide complete uniform depletion of the organometallic precursor material.

The bubbler of the present invention includes a dual chambered cylindrically shaped vessel for producing vapors of solid organometallic precursor using a carrier gas. Such bubblers have an elongated cylindrical shaped portion having an inner surface defining a substantially constant cross-section throughout the length of the cylindrical portion, a top closure portion, a bottom closure portion, and inlet and outlet chambers in fluid communication and separated by a porous element, the top closure portion having a fill plug and a gas inlet opening, the fill plug and gas inlet opening communicating with the inlet chamber, the outlet opening communicating with the outlet chamber, the inlet chamber having a conical shaped lower portion containing the porous element, the porous element being spaced from the bottom closure portion.

These bubblers may be constructed of any suitable material, such as glass, poly(tetrfluoroethylene) or metal, as long as the material is inert to the organometallic compound contained therein. Metals are preferred, and particularly nickel alloys and stainless steels. Suitable stainless steels include, but are not limited to, 304, 304 L, 316, 316 L, 321, 347 and 430. Suitable nickel alloys include, but are not limited to, INCONEL, MONEL, HASTELLOY and the like. It will be appreciated by those skilled in the art that a mixture of materials may be used in the manufacture of the present bubblers.

The porous element is typically a frit having a controlled porosity. Porous elements having a wide variety of porosities may be used in the present invention. The particular porosity will depend upon the a variety of factors well within the ability of one skilled in the art. Typically, the porous element has a pore size of from about 1 to about 100 microns, preferably from about 1 to about 10 microns. However, porous elements having porosities greater than 100 microns may be suitable for certain applications. Any material may be used to construct the frit provided it is inert to the organometallic compound used and the desired porosity can be controlled. Suitable materials include, but are not limited to, glass, poly(tetrfluoroethylene) or metals such as stainless steels or nickel alloys. It is preferred that the porous element is sintered metal, and more preferably stainless steel. The suitable stainless steels and nickel alloys suitable for preparing the porous element are those described above for the manufacture of the bubbler.

The porous element is contained in the conical lower portion of the inlet chamber. The porous element retains the solid organometallic precursor in the inlet chamber and the combination of the conical section and porous element provides a restriction for the gas flow. This restriction affords uniform carrier gas flow through the packed solid organometallic precursor. The conical section enhances the movement of solid precursor within the bubbler and directs the solid material onto the porous, i.e. fritted, surface. This is particularly important towards the end of the bubbler life and improves the yield from the bubbler. The conical section of the lower portion of the inlet chamber may be of any angle, such as from 1 to 89 degrees. Preferably, the conical section has an angle of about 60 degrees or greater.

The size of the porous element is not critical. For example, the porous member may be a disk having a diameter of about 1 inch (2.54 cm) and a thickness of about 0.125 inches (0.32 cm). In an alternative embodiment, the porous element may have an inner tube concentric with its outer diameter.

The cross-sectional dimension of the bubbler is critical to the performance of the cylinder, otherwise the dimensions of the bubbler are not critical and are dependent upon the carrier gas flow, the precursor compound to be used, the particular chemical vapor deposition system used and the like. The cross-sectional dimension determines at a given pressure and flow rate the linear velocity of the gas in the cylinder, which in turn controls the contact time between the precursor material and carrier gas and thus saturation of the carrier gas. Typically, the bubbler has a cross-sectional dimension of about 2 inches (5 cm) to about 6 inches (15 cm). The other dimensions for a particular bubbler are thus well within the ability of one skilled in the art.

A wide variety of organometallic compound precursors may be used with the bubblers of the present invention. While solid or liquid organometallic precursors may be used with the present bubblers, it is preferred that solid organometallic precursors are used. Suitable organometallic precursors include, but are not limited to, cyclopentadienyl magnesium, trialkyl aluminum such as trimethyl aluminum and triethyl aluminum, trialkyl gallium such as trimethyl gallium and triethyl gallium, trialkyl antimony such as trimethyl antimony, dimethyl hydrazine, trialkyl indium such as trimethyl indium, and the like. It is preferred that the organometallic precursor is cyclopentadienyl magnesium and trialkyl indium and more preferably trimethyl indium. Such organometallic precursors are generally commercially available from a variety of suppliers.

Any suitable carrier gas may be used with the present bubblers as long as it does not react with the organometallic precursor. The particular choice of carrier gas depends upon a variety of factors such as the organometallic precursor, the particular chemical vapor deposition system employed and the like. Suitable carrier gasses include, but are not limited to, hydrogen, nitrogen, argon, helium and the like. Hydrogen is preferred. The carrier gas may be used with the present bubblers at a wide variety of flow rates. Such flow rates are a function of the bubbler cross-sectional dimension and pressure. Larger cross-sectional dimensions allow higher carrier gas flows, i.e. linear velocity, at a given pressure. For example, when the bubbler has a 2 inch cross-sectional dimension, carrier gas flow rates of up to about 500 sccm may be used, although higher gas flow rates may be used. The carrier gas flow entering the bubbler, exiting the bubbler or both entering and exiting the bubbler may be regulated by a control means. Any conventional control means may be used, such as manually activated control valves or computer activated control valves.

In general, the organometallic precursor compound is added to the bubbler inlet chamber through a fill port in the top portion of the bubbler. In use, the bubbler may be used at a variety of temperatures. The exact temperature will depend upon the particular precursor compound used and desired application. The temperature controls the vapor pressure of the precursor compound, which controls the flux of the material needed for specific growth rates or alloy compositions. Such temperature selection is well within the ability of one skilled in the art. For example, when the organometallic precursor compound is trimethyl indium, the temperature of the bubbler may be from about 10° to about 60° C., preferably from about 35° to about 55°, and more preferably from about 35° to about 50° C. The present bubblers may be heated by a variety of heating means, such as by placing the bubbler in a thermostatic bath, by direct immersion of the bubbler in a heated oil bath or by the use of a halocarbon oil flowing through a metal tube, such as a copper tube, surrounding the bubbler.

The carrier gas enters the bubbler inlet chamber through the inlet opening at the top of the bubbler. The carrier gas then passes through the organometallic precursor and picks-up vaporized precursor to form a gas stream including vaporized precursor admixed with carrier gas. The amount of vaporized precursor picked-up by the carrier gas may be controlled. It is preferred that the carrier gas is saturated with vaporized precursor. The carrier gas is then directed by means of a conical shaped lower portion of the inlet chamber to a porous element located at the tip of the conical section. The carrier gas exits the inlet chamber through the porous element to the outlet chamber which is in fluid contact with the inlet chamber. The carrier gas then exits the outlet chamber through the outlet opening and is directed to a chemical vapor deposition system. The bubblers of the present invention may be used with any chemical vapor deposition system.

FIG. 1 illustrates a conventional dip-tube bubbler design of the type disclosed in U.S. Pat. No. 4,506,815 including an elongated cylindrical container 1, an inlet tube 2 for delivering carrier gas, and an outlet tube 3 for exhausting the precursor vapor which terminates in a dip-tube 4 which extends into the precursor material contained in the vessel.

FIG. 2 illustrates cross-sectional view of a bubbler of the present invention having an annular design. In this embodiment, an elongated cylindrical container 10 having an inner surface 11 defining a substantially constant cross-section throughout the length of cylinder 10, a top closure portion 15 and a bottom closure portion 16 having a flat inner bottom portion 17. Top closure portion 15 has fill port 18, inlet opening 19 and outlet opening 20. Inlet tube 12 and outlet tube 13 communicate with inlet opening 19 and outlet opening 20 respectively, in closure portion 15 of the container. Carrier gas flow entering the container through inlet tube 12 is regulated by control valve CV1. Carrier gas flow exiting the container through outlet tube 13 is regulated by control valve CV2. The lower end of the inlet opening 19 communicates directly with inlet chamber 25 having a conical shaped lower portion 21. Inlet chamber 25 and out let chamber 30 are in fluid communication by means of porous member 14. Porous member 14 is located at the tip or bottom of the conical section 21 of the inlet chamber. Outlet opening 20 communicates directly with outlet chamber 30.

FIG. 2A shows a cross-section through A of the conical section 21 of the lower portion of the inlet chamber 25 of the bubbler of FIG. 2, including porous element 14.

Carrier gas enters the container through inlet tube 12 and into inlet chamber 25 containing the organometallic precursor. The carrier gas picks up the vaporized organometallic precursor to form a gas stream. The gas stream exits the inlet chamber 25 through porous element 14 and enters outlet chamber 30. The gas stream then exits the outlet chamber 30 through outlet opening 20 into outlet tube 13 and then is directed into a chemical vapor deposition system.

FIG. 3 illustrates cross-sectional view of a bubbler of the present invention having a non-annular design. In this embodiment, an elongated cylindrical container 10 having an inner surface 11 defining a substantially constant cross-section throughout the length of cylinder 10, a top closure portion 15 and a bottom closure portion 16 having a flat inner bottom portion 17. Top closure portion 15 has fill port 18, inlet opening 19 and outlet opening 20. Inlet tube 12 and outlet tube 13 communicate with inlet opening 19 and outlet opening 20 respectively, in closure portion 15 of the container. Carrier gas flow entering the container through inlet tube 12 is regulated by control valve CV1. Carrier gas flow exiting the container through outlet tube 13 is regulated by control valve CV2. The lower end of the inlet opening 19 communicates directly with inlet chamber 25 having a center tube 31 concentric to its outer diameter and a conical shaped lower portion 21. Inlet chamber 25 and out let chamber 30 are in fluid communication by means of porous member 14. Porous member 14 is located at the tip or bottom of the conical section 21 of the inlet chamber. Outlet opening 20 communicates with outlet chamber 30 by means of center tube 31.

FIG. 3A is shows a cross-section through A of the conical section 21 of the lower portion of the inlet chamber 25 of the bubbler of FIG. 3, including porous element 14 and center tube 31.

Carrier gas enters the container through inlet tube 12 and into inlet chamber 25 containing the organometallic precursor. The carrier gas picks up the vaporized organometallic precursor to form a gas stream. The gas stream exits the inlet chamber 25 through porous element 14 and enters outlet chamber 30. The gas stream then passes through center tube 31 and exits the outlet chamber 30 through outlet opening 20 into outlet tube 13 and then is directed into a chemical vapor deposition system.

While the present invention may be used at a variety of system pressures, an advantage of the present invention is that lower pressures may be used. The bubblers of the present invention have the additional advantage of providing bubblers having uniform carrier gas flow through the packed solid organometallic precursor. The conical sections of the present bubblers also enhance the movement of solid precursor within the bubbler and direct the solid material onto the surface of the element.

The non-annular bubbler design of the present invention has the further advantage of having improved heat transfer. The single wall of the non-annular design and the lack of an annular space leads to improved heat transfer. The center tube of the non-annular design affords additional heat transfer to the center of the solid precursor material. Such non-annular design provides a more consistent operation temperature.

What is claimed is:

1. A bubbler-type device for providing vaporized organometallic compound to a chemical vapor deposition system comprising a vessel having an elongated cylindrical shaped portion having an inner surface defining a substantially constant cross-section throughout the length of the cylindrical portion, a top closure portion, a bottom closure portion, and inlet and outlet chambers in fluid communication and separated by a porous element, the top closure portion having a fill plug and a gas inlet opening, the fill plug and gas inlet opening communicating with the inlet chamber, an outlet opening communicating with the outlet chamber, the inlet chamber having a conical shaped lower portion containing the porous element, the porous element being spaced from the bottom closure portion, the porous element forming the floor of the inlet chamber, and wherein the conical shaped lower portion decreases in cross-section toward the porous element.

2. The device of claim 1 wherein the porous element has a concentric inner tube.

3. The device of claim 1 wherein the porous element is a frit.

4. The device of claim 3 wherein the frit is sintered metal.

5. The device of claim 1 wherein the porous member has a pore size of from about 1 to about 100 microns.

6. A method for providing organometallic precursor compound in the vapor phase to a chemical vapor deposition system comprising the steps of: a) introducing an organometallic precursor compound into the device of claim 1; b) heating the organometallic precursor compound; c) passing a carrier gas through the organometallic precursor compound to provide a gas stream containing vaporized organometallic precursor compound; and d) delivering the gas stream to a chemical vapor deposition system.

7. The method of claim 6 wherein the organometallic precursor is selected from cyclopentadienyl magnesium, trialkyl aluminum, trialkyl gallium, trialkyl antimony, dimethyl hydrazine, or trialkyl indium.

8. The method of claim 7 wherein the organometallic precursor is selected from cyclopentadienyl magnesium or trialkyl indium.

9. The method of claim 8 wherein the organometallic precursor is trimethyl indium.

10. The method of claim 8 wherein the organometallic precursor is heated at a temperature in the range of from about 10° to about 60° C.

11. The method of claim 6 wherein the carrier gas is selected from hydrogen, nitrogen, argon or helium.

12. An apparatus for chemical vapor deposition of an organometallic precursor compound comprising the device of claim 1.

* * * * *